United States Patent
Itahara

(10) Patent No.: US 7,457,979 B2
(45) Date of Patent: Nov. 25, 2008

(54) SYNCHRONOUS FOLLOW-UP APPARATUS AND SYNCHRONOUS FOLLOW-UP METHOD

(75) Inventor: Hiroshi Itahara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 82 days.

(21) Appl. No.: 10/598,617

(22) PCT Filed: Jul. 29, 2005

(86) PCT No.: PCT/JP2005/014360

§ 371 (c)(1),
(2), (4) Date: Sep. 6, 2006

(87) PCT Pub. No.: WO2006/011680

PCT Pub. Date: Feb. 2, 2006

(65) Prior Publication Data

US 2007/0195916 A1    Aug. 23, 2007

(30) Foreign Application Priority Data

Jul. 30, 2004    (JP)    ............................ 2004-223887

(51) Int. Cl.
*G06F 1/00* (2006.01)
(52) U.S. Cl. ..................................... 713/500; 375/376
(58) Field of Classification Search ................. 713/500; 375/376

See application file for complete search history.

(56) References Cited

U.S. PATENT DOCUMENTS

| | | | |
|---|---|---|---|
| 6,333,678 B1 | 12/2001 | Brown et al. | |
| 6,496,555 B1 * | 12/2002 | Soda | ........................... 375/376 |
| 2002/0180498 A1 | 12/2002 | O'Leary et al. | |
| 2004/0012423 A1 * | 1/2004 | Maeda | ......................... 327/156 |
| 2004/0070431 A1 * | 4/2004 | Henrickson | ................. 327/149 |
| 2005/0129158 A1 * | 6/2005 | Kuwata | ......................... 375/376 |
| 2005/0281367 A1 * | 12/2005 | Lesso | ......................... 375/376 |

FOREIGN PATENT DOCUMENTS

WO    03/026133 A1    3/2003

OTHER PUBLICATIONS

"CPRI Specification V2.0, Common Public Radio Interface (CPRI); Interface Specification", Developed by Ericsson AB, Huawei Technologies Co., Ltd., NEC Corporation, Nortel Networks SA and Siemens AG, Oct. 1, 2004, pp. 1-75.

* cited by examiner

*Primary Examiner*—Thomas Lee
*Assistant Examiner*—Vincent T Tran
(74) *Attorney, Agent, or Firm*—Pearne & Gordon LLP

(57) ABSTRACT

A synchronous follow-up apparatus includes a PLL portion that outputs a first clock signal, and a control loop portion. The control loop portion includes a reference frequency signal generating portion that outputs a reference frequency signal, a clock signal generating portion that generates a second clock signal having the same frequency as a frequency of the first clock signal based on the reference frequency signal generated by the reference frequency signal generating portion, and a frequency control signal generating portion that generates a frequency control signal to change the frequency of the second clock signal based on a frequency difference between the first clock signal and the second clock signal that occurs after a predetermined time and outputs the frequency control signal to the clock signal generating portion.

7 Claims, 7 Drawing Sheets

SYNCHRONOUS FOLLOW-UP APPARATUS AND SYNCHRONOUS FOLLOW-UP METHOD

TECHNICAL FIELD

The present invention relates to a synchronous follow-up apparatus and a synchronous follow-up method.

BACKGROUND ART

There has been a CPRI (Common Public Radio Interface)® as the standard of an interface between a radio equipment control (REC) for carrying out a baseband processing and a radio equipment (RE) for carrying out a radio signal processing in the case that the internal structure of a base station apparatus such as a WCDMA mobile telecommunication system is divided into the radio equipment control and the radio equipment and they are connected to each other through a digital transmission path (see "CPRI Specification", First Edition, issued on Sep. 30, 2003).

FIG. 7 is a diagram showing a relationship between the radio equipment control and the radio equipment. A base station apparatus 200 includes a radio equipment control 201 and a radio equipment 202, and the radio equipment control 201 and the radio equipment 202 are connected to each other through a digital transmission path 203 for transmitting an electric signal or a light signal.

The radio equipment control 201 is connected to a radio network control (RNC) 210 to carry out the baseband processing. Moreover, the radio equipment 202 serves to carry out a processing in a radio frequency band and to perform a radio communication with a terminal device 220.

In the standard of the CPRI®, a line rate in the digital transmission path 203 is defined, and the reference frequency of the radio equipment 202 is to be synchronized with the reference frequency of the line rate. In the standard of the CPRI, there are 32 basic demand items. Above all, there are the following three demand items for a synchronizing performance.

A first demand is that an fc (line selection cutoff frequency) synchronizing range of 300 Hz in the radio equipment is to be ensured (a demand number of R-17), a second demand is that a jitter stability in the radio equipment (an REC-RE synchronizing system after a synchronization) is to be ensured at ±0.002 ppm (R-18), and a third demand is that a synchronization is to be established in a line clock OFF-ON transient state within 10 seconds (R-30).

However, these three demands are contrary to each other in the case that a synchronizing loop is to be designed by using an ordinary PLL circuit. For example, when the PLL circuit is designed in order to ensure a cutoff frequency demanded in the R-17, it is impossible to ensure a precision in a synchronization which is demanded in the R-18. In order to ensure the precision in the synchronization which is demanded in the R-18, furthermore, it is very hard to establish the synchronization in a time demanded in the R-30. Accordingly, there is a situation in which it is very hard to satisfy these demands at the same time.

DISCLOSURE OF THE INVENTION

In consideration of the circumstances, it is an object of the invention to provide a synchronous follow-up apparatus and a synchronous follow-up method capable of implementing a synchronization establishing time having a high precision in a synchronization within a constant time to satisfy a cutoff frequency.

In order to achieve the above object, according to the present invention, there is provided a synchronous follow-up apparatus, comprising:
a PLL portion that outputs a first clock signal; and
a control loop portion that includes:
a reference frequency signal generating portion that outputs a reference frequency signal;
a clock signal generating portion that generates a second clock signal having the same frequency as a frequency of the first clock signal based on the reference frequency signal generated by the reference frequency signal generating portion; and
a frequency control signal generating portion that generates a frequency control signal to change the frequency of the second clock signal based on a frequency difference between the first clock signal and the second clock signal that occurs after a predetermined time and outputs the frequency control signal to the clock signal generating portion.

Preferably, the PLL portion includes:
a voltage controlled oscillating portion that outputs an output signal as the first clock signal; and
a control voltage generating portion that detects a phase difference between a receiving signal and the output signal from the voltage controlled oscillating portion and generates a control voltage signal for inputting to the voltage controlled oscillating portion based on the phase difference.

Preferably, the PLL portion is an LSI having a PLL function.

According to the present invention, there is also provided a synchronous follow-up method, comprising:
outputting a first clock signal from a PLL portion;
outputting a reference frequency signal;
generating a second clock signal having the same frequency as a frequency of the first clock signal based on the reference frequency signal;
detecting a frequency difference between the first clock signal and the second clock signal that occurs after a predetermined time;
generating a frequency control signal based on the frequency difference; and
outputting the frequency control signal to change the frequency of the second clock signal.

Preferably, the synchronous follow-up method, further comprising:
outputting an output signal from a voltage controlled oscillating portion as the first clock signal;
detecting a phase difference between a receiving signal and the output signal; and
generating a control voltage signal based on the phase difference to change the frequency of the output signal.

By the above structures and methods, it is possible to implement a synchronization establishing time having a high precision in a synchronization within a constant time to satisfy a cutoff frequency by the PLL portion for maintaining the cutoff frequency and the control loop portion for ensuring a high precision in a synchronization and implementing a short synchronization establishing time.

Preferably, the frequency control signal generating portion outputs a preceding frequency control signal which achieved a frequency tuning between the first clock signal and the second clock signal most recently when the detected frequency difference between the first clock signal and the second clock signal is equal to or greater than a predetermined value. The clock signal generating portion outputs the second clock signal as a radio reference signal based on the frequency control signal output from the frequency control signal generating portion.

Preferably, in the generating process of the frequency control signal, a preceding frequency control signal which achieved a frequency tuning between the first clock signal and the second clock signal most recently is generated when the frequency difference in the detecting process is equal to or greater than a predetermined value; and the synchronous follow-up method further comprises, outputting the second clock signal as a radio reference signal based on the frequency control signal.

By the above structure and method, also in the case that a fault is caused on a receiving signal for some reason, a stable radio reference signal can be output within the range of the reference frequency accuracy of the reference signal generating portion.

According to the invention, it is possible to provide a synchronous follow-up apparatus capable of implementing a synchronization establishing time having a high precision in a synchronization within a constant time to satisfy a cutoff frequency.

BRIEF DESCRIPTION OF THE DRAWINGS

The above objects and advantages of the present invention will become more apparent by describing in detail preferred exemplary embodiments thereof with reference to the accompanying drawings, wherein.

BEST MODE FOR CARRYING OUT THE INVENTION

First, the synchronous follow-up of a CPRI® interface will be explained in respect of the case that a synchronizing loop using a PLL is to be implemented. In the CPRI®, there are defined three types of line rates of the transmission path for connecting the radio equipment control and the radio equipment which have been described in the Background Art. In the following, description will be given to the case that the line rate of a digital transmission path is 1228.8 [Mbps] as one of the defined line rates.

Figure 6:
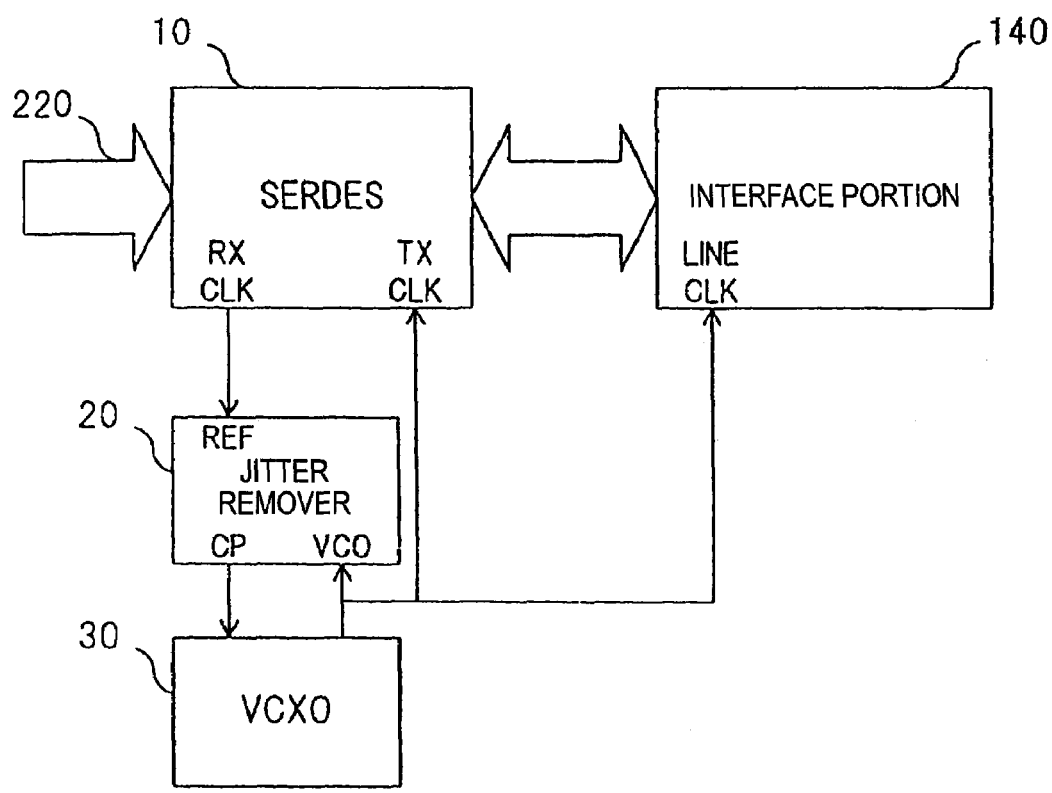
FIG. 6 is a diagram showing an example of a structure in the case that a synchronous loop using a PLL is utilized.
Figure 7:
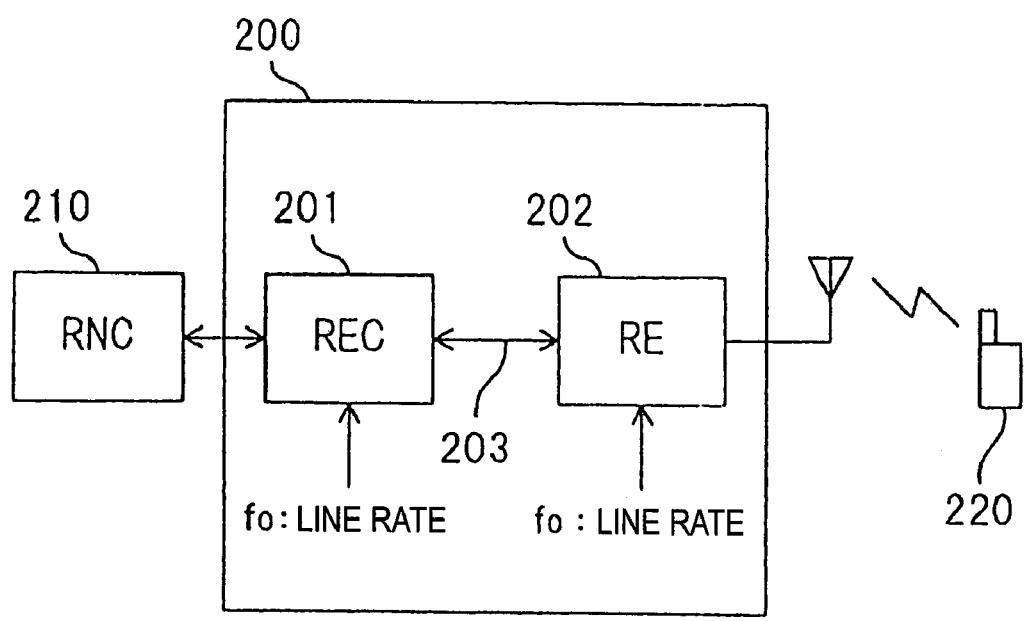
FIG. 7 is a diagram showing a relationship between a radio equipment control and a radio equipment.

FIG. 6 is a diagram showing an example of a structure in which a synchronizing loop using a PLL is utilized for the CPRI® interface. As shown in FIG. 6, the interface includes a serializer/deserializer (which will be hereinafter referred to as a SERDES) synchronizing loop having a SERDES 10 connected to a digital transmission path 220, a jitter remover 20 of a PLL base and a voltage controlled crystal oscillator (hereinafter referred to as a VCXO) 30, and an interface portion 140 for inputting, as a line clock, a clock signal output from the VCXO 30.

The SERDES 10 serial/parallel converts a serial signal received through the transmission path 220 into a parallel signal and transmits the received data to the interface portion 140, and regenerates and outputs a receiving clock signal (RXCLK). The jitter remover 20 has a PLL base, and sets the receiving clock signal output from the SERDES 10 to be a reference signal (REF) and carries out a phase comparison with a signal (VCO) input from the VCXO 30, and converts the same signal into a voltage signal to be output as a control voltage (CP) of the VCXO 30. Thus, a PLL is constituted by the jitter remover 20 and the VCXO 30.

A signal output from the VCXO 30 is input as a transmission clock (TXCLK) of the SERDES 10, and furthermore, is input as a line clock (LINECLK) of the interface portion 140.

The cutoff frequency of the PLL constituted by the jitter remover 20 and the VCXO 30 is to be set to 300 Hz (0.1 ppm) in accordance with the demand item R-17. In order to cover the cutoff frequency, however, it is impossible to regulate the loop bandwidth and loop gain of the PLL in order to ensure a precision in a synchronization of 0.002 ppm which is demanded in the R-18. To the contrary, in the case that the regulation is carried out in order to ensure the precision in a synchronization which is demanded in the R-18, it is impossible to cover the cutoff frequency demanded in the R-17.

Furthermore, the signal output from the VCXO which has the output frequency of the PLL is input as the line clock of the interface portion. In the CPRI®, however, the line clock is also used as a reference signal for a radio signal processing. Accordingly, an excellent CN characteristic is also demanded.

If the precision in a synchronization which is demanded in the R-18 is to be ensured, it is hard to implement the provisions of the R-30. The PLL regulated to ensure the precision in a synchronization gives a transient response slowly. For this reason, in the case that a precision of ±0.002 ppm demanded in the R-18 is to be ensured, it is really impossible to carry out lock-up within 10 seconds which is demanded in the R-30.

In consideration of the investigations, a control loop for ensuring a high precision in a synchronization and implementing a short synchronization establishing time is provided in addition to the PLL for maintaining a lock range. Consequently, it is possible to implement a synchronous follow-up apparatus which satisfies the demands of the CPRI®, for example.

Figure 1:
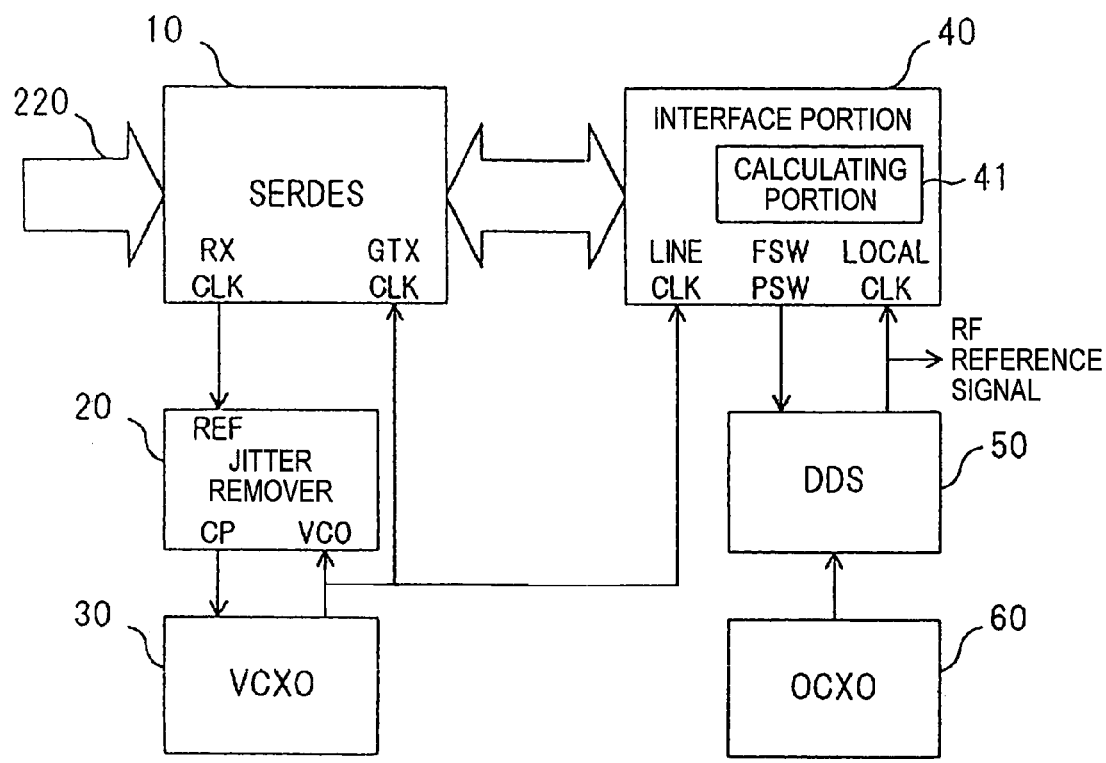
FIG. 1 is a diagram showing the schematic structure of a synchronous follow-up apparatus according to an embodiment of the invention.

An embodiment of the invention will be described below with reference to the drawings. FIG. 1 is a diagram showing the schematic structure of a synchronous follow-up apparatus according to the embodiment of the invention. Overlapping portions with the portions in FIG. 6 have the same reference numerals and explains of the overlapping portions are omitted.

As shown in FIG. 1, the synchronous follow-up apparatus according to the embodiment includes a SERDES 10 connected to a digital transmission path 220, a jitter remover 20, a VCXO 30, an interface portion 40, a direct digital synthesizer 50, and a temperature controlled crystal oscillator (hereinafter referred to as an OCXO) 60.

The jitter remover 20 and the VCXO 30 constitute a PLL for setting, as a reference signal, a receiving clock signal output from the SERDES 10 as described with reference to FIG. 6. The jitter remover 20 and the VCXO 30 are designed to satisfy a lock range of 300 Hz which is demanded in the R-17. In demand items R-27 and R-28, furthermore, it is demanded that a bit error rate (BER) in a data transmission is to be equal to or less than $10^{-12}$. The design is also carried out in order to satisfy this demand. Consequently, it is possible to ensure the quality of the transmission of a digital transmission line.

The DDS 50 creates, from a reference signal sent from the OCXO 60, a local clock signal (LOCALCLK) having the same frequency as the frequency of a line clock signal to be regenerated from the digital transmission path and output from the PLL, and inputs the local clock signal to a calculating portion 41 of the interface portion 40. The calculating portion 41 generates a frequency control signal (FSW) based on a frequency difference between the input line clock signal and local clock signal which is made after a predetermined time, and outputs the frequency control signal to the DDS 50.

The DDS 50 corrects the local clock signal based on the frequency control signal sent from the calculating portion 41. Thus, it is possible to satisfy a demand for a synchronization establishing time while ensuring a precision in a synchronization through a control loop formed by the line clock signal, the frequency control signal and the local clock signal.

Figure 2:
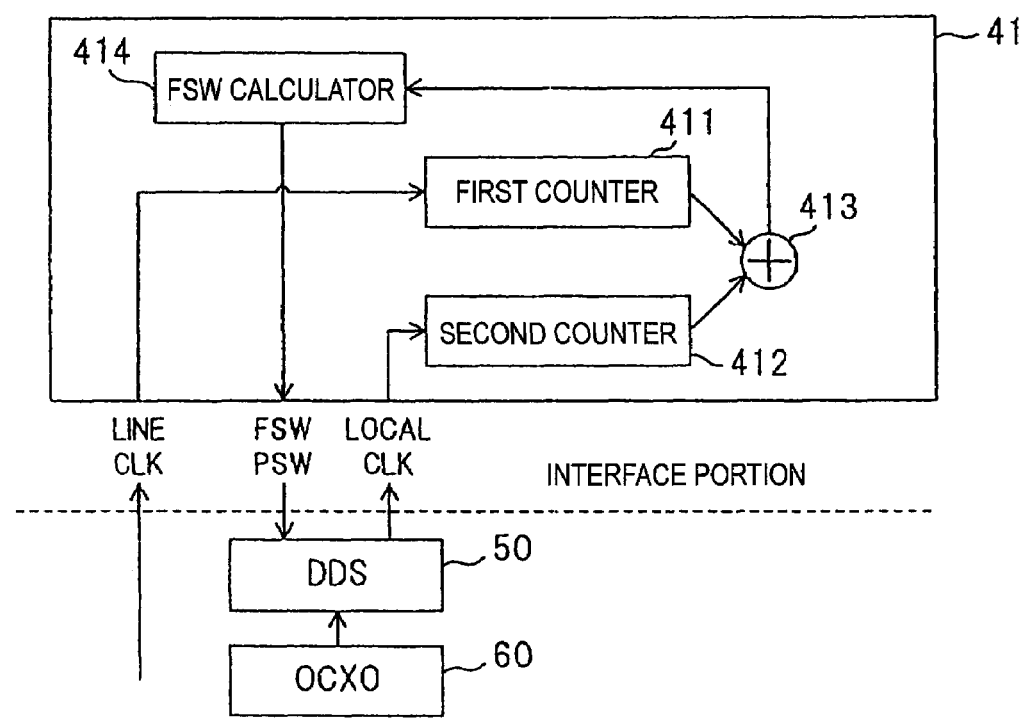
FIG. 2 is a diagram showing a control loop including the schematic structure of a calculating portion.

The control loop will be described below in detail. FIG. 2 is a diagram showing a control loop including the schematic structure of the calculating portion. A normal line clock signal has a standard value of approximately 1/16 to 1/20 minute of a line rate (1.2288 GHz in the embodiment), that is, 76.8 MHz to 61.44 MHz. In the embodiment, description will be given by taking, as an example, the case that the line clock signal has a frequency of 61.44 MHz.

As shown in FIG. 2, the calculating portion 41 has a first counter 411, a second counter 412, an adder 413 and an FSW calculator 414.

The first counter 411 is operated synchronously with the frequency of the line clock signal which is input.

Moreover, the second counter 412 is operated synchronously with the frequency of the local clock signal sent from the DDS 50. A difference after a predetermined time between the first counter 411 and the second counter 412 is observed as a phase difference M between two clock signals. The FSW calculator 414 generates the frequency control signal of the DDS 50 based on the phase difference M.

For example, in the case that the counter phase difference M is detected as a phase difference after Z seconds, it is given by Equation (1).

$$M = Y \cdot Z - X \cdot Z \quad (1)$$

Herein, Y represents a frequency [Hz] of a local clock signal, X represents a frequency [Hz] of a line clock signal, and Z represents a counter observing time [second].

The line clock signal is synchronized with data transmitted from a radio equipment control 201. For this reason, a reference precision is set to be 0.05 ppm in accordance with a 3GPP standard, for example. Since the local clock signal is synchronized with a reference precision (for example, ±0.1 ppm) from the OCXO 60, a precision of ±0.1 ppm is obtained.

Based on the Equation (1), a frequency difference (Y−X) between the local clock signal and the line clock signal is given by Equation (2).

$$(Y-X) = M/Z \ [Hz] \quad (2)$$

Assuming that the frequency X of the line clock signal is 61.44 [MHz], a tuning frequency Y is given by Equation (3).

$$Y = 61.44 \times 10^6 + M/Z \ [Hz] \quad (3)$$

Then, a control is carried out to change the frequency of the DDS 50 based on the tuning frequency Y.

A frequency tuning word (FSW) to be a frequency control signal has a value obtained by dividing the tuning frequency by a minimum resolution frequency Δf of the DDS 50 as shown in Equation (4).

$$FSW = \text{tuning frequency } Y/\Delta f \quad (4)$$

Usually, the DDS 50 has a frequency resolution which is a fraction of the power of two (R: approximately 32, ordinarily) of a sampling rate. In the embodiment, the frequency of the OCXO 60 is set to be 10 MHz and the sampling rate of the DDS 50 is set to be 200 MHz which is twenty times as great as that of the OCXO 60. If R=32 is set, a frequency correcting resolution per FSW1 unit is $200 \times 10^6/2^{32} = 0.046$ [Hz].

The frequency correcting resolution ensures a precision of 0.00075 ppm for a comparison frequency of 61.44 MHz. In order to achieve a synchronizing precision of 0.002 ppm, a count observing time of 8.2 seconds is theoretically required when a comparison frequency of 61.44 MHz is used.

Figure 3:
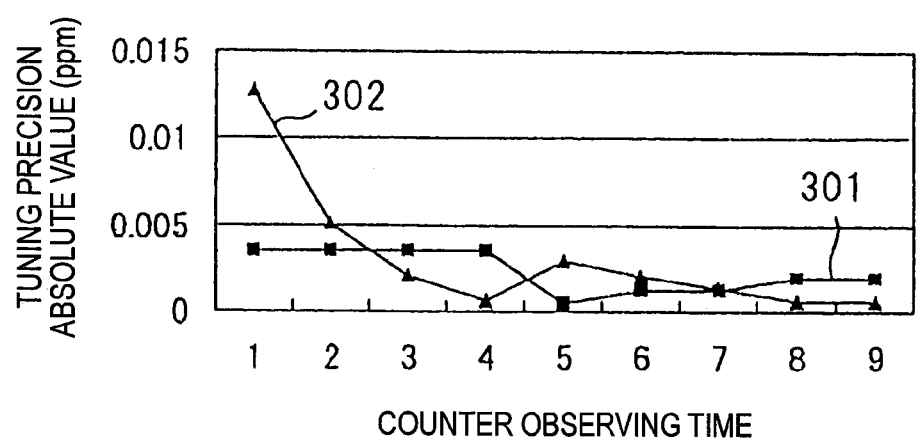
FIG. 3 is a chart showing a tuning convergence characteristic.

FIG. 3 is a chart showing a tuning convergence characteristic. In FIG. 3, a curve 301 represents a simulation result of a tuning convergence characteristic on a line clock signal from a line clock signal (+0.005 ppm) and a local clock signal (−0.1 ppm), and a curve 302 represents a simulation result of a synchronizing convergence characteristic on a line clock signal from a line clock signal (−0.005 ppm) and a local clock signal (+0.1 ppm). As shown in FIG. 3, it is apparent that a synchronizing precision of 0.002 ppm is achieved in an observing time after a theoretical value of approximately 8.2 seconds. Thus, the synchronizing precision of 0.002 ppm demanded in the R-18 can satisfy a synchronizing establishment within 10 seconds which is demanded in the R-30.

Thus, the control loop for ensuring a high precision in a synchronization and implementing a short synchronization establishing time is provided in addition to the PLL for maintaining a lock range. Consequently, it is possible to implement a synchronization establishing time having a high precision in a synchronization within a constant time to satisfy the cutoff frequency.

Figure 4:
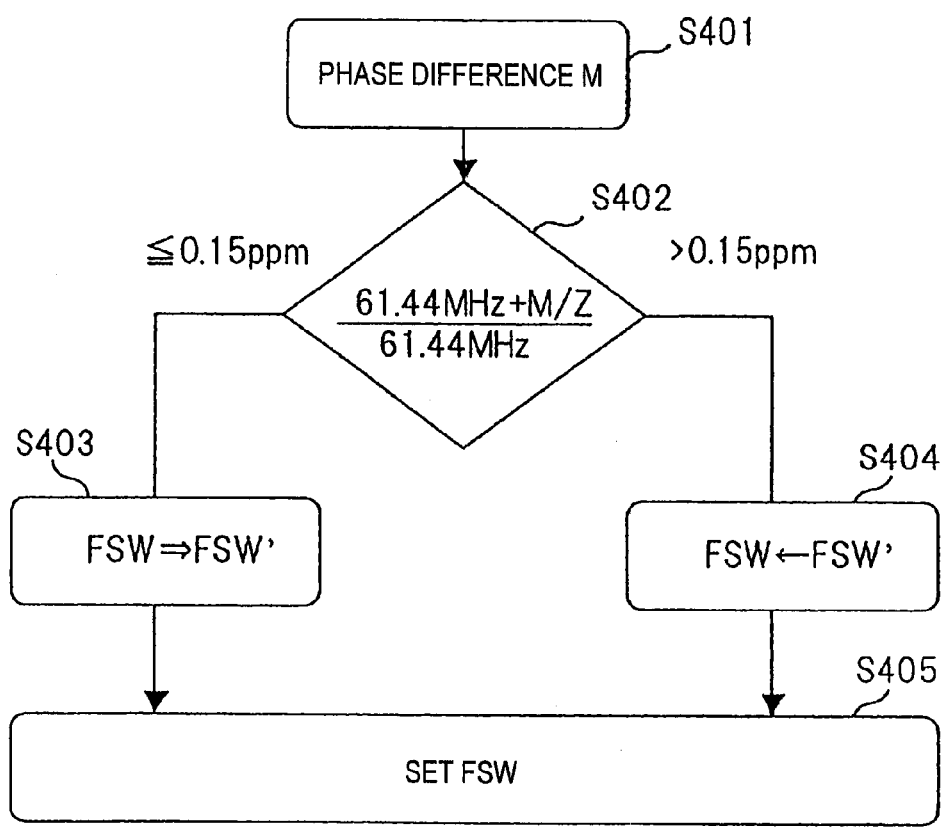
FIG. 4 is a diagram showing the operation of an FSW calculator in the fault of a line clock.

Next, description will be given to a control for the cutoff, disturbance and instantaneous stop of a line clock signal which is caused by the fault of a digital transmission path. FIG. 4 is a diagram showing the operation of the FSW calculator in the fault of the line clock.

As shown in FIG. 4, the FSW calculator 414 first acquires a phase difference M (Step S401). Then, a tuning frequency and a line clock frequency are compared with each other based on the phase difference M thus acquired (Step S402). If an error between these frequencies has a predetermined value (0.15 ppm in the embodiment) or less, FSW is set to be FSW' (Step S403). At this time, the FSW is set (Step S404). The FSW' represents FSW which is successfully subjected to frequency tuning in the closest past. The predetermined value of the error, that is, 0.15 ppm is a maximum error between the maximum difference (±0.1 ppm) of the OCXO and the frequency precision difference of the reference frequency (±0.05 ppm) of the radio equipment control (RES).

If the error between these frequencies is greater than the predetermined value (0.15 ppm in the embodiment), the FSW' to be the FSW subjected to tuning in the closest past is substituted for the FSW (S404) and is set to be the FSW (Step S405).

More specifically, in this example, it is decided whether or not a fault is generated on the line clock depending on the difference between the tuning frequency and the line clock frequency. If it is decided that the fault is generated, the frequency of the DDS is controlled by using a frequency control signal which is successfully subjected to the frequency tuning in the closest past.

The DDS 50 refers the OCXO 60 as a reference frequency. Therefore, it is possible to ensure the stability of a reference signal for a radio processing within the stability of the OCXO 60 (for example, ±0.1 ppm). Even if a fault is generated on the line clock for some reason, for example, the disconnection of the digital transmission path, accordingly, it is possible to ensure the stability of the output radio frequency of the radio equipment 202.

Moreover, the CN characteristic of an RF reference signal can also be ensured to be high by the OCXO 60 and the DDS 50 irrespective of the quality of the line clock signal. Therefore, it is possible to obtain the stability by causing an EVM (Error Vector Magnitude) or a PCDE (Peak Code Domain Error) to be independent of the quality of the transmission of the line clock signal.

By such a structure, it is possible to implement a synchronizing performance which is demanded, and furthermore, to obtain the absolutely stable and excellent CN characteristic of an RF reference signal within the range of the reference frequency accuracy of the OCXO, thereby enhancing the radio performance of the radio equipment (RE).

Figure 5:
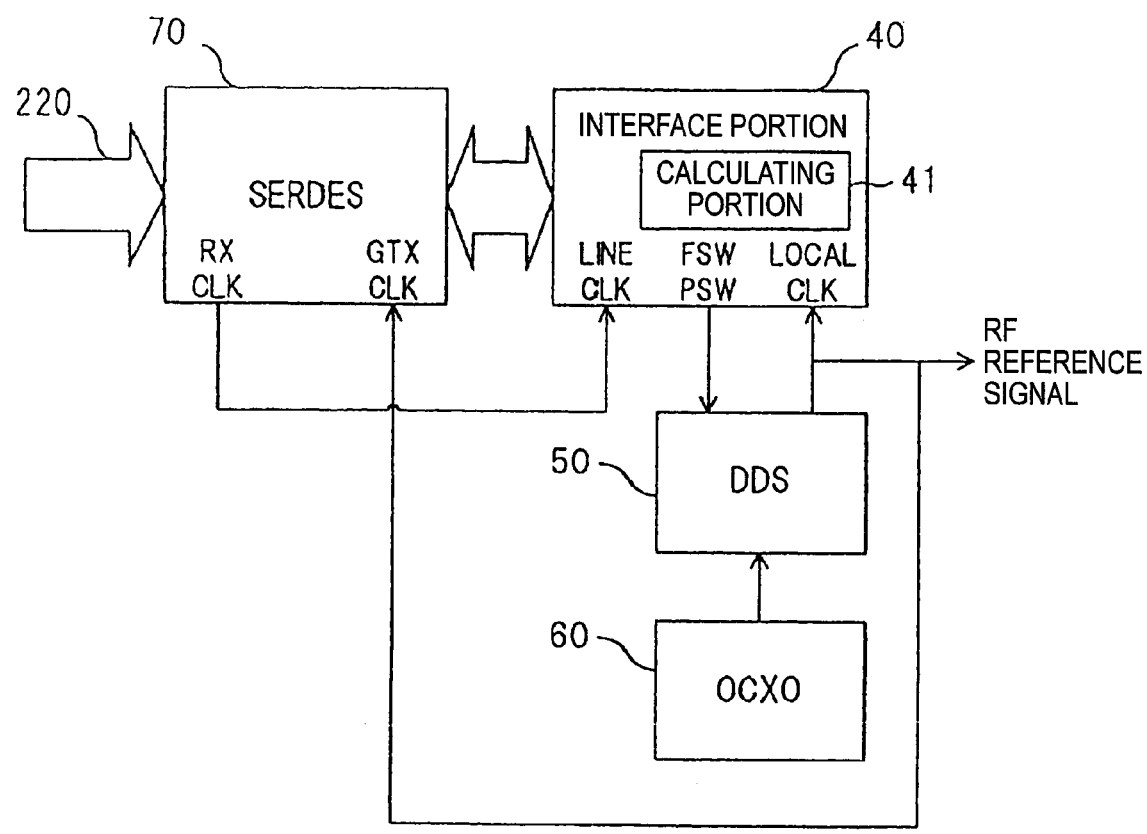
FIG. 5 is a diagram showing another example of the synchronous follow-up apparatus according to the embodiment of the invention.

FIG. 5 is a diagram showing a synchronous follow-up apparatus according to a second embodiment of the invention. In this example, there is shown the case that an LSI having a PLL function and a sufficient lock performance (for example, approximately ±10 ppm) is used as a SERDES 70. By using the SERDES 70, it is possible to eliminate the jitter remover shown in FIG. 1, thereby simplifying the structure of the synchronous follow-up apparatus.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2004-223887 filed on Jul. 30, 2005, the contents of which are incorporated herein for reference.

INDUSTRIAL APPLICABILITY

The synchronous follow-up apparatus according to the invention has an advantage that it is possible to implement a synchronous establishing time having a high precision in a synchronization within a constant time to satisfy the cutoff frequency, and is useful for a radio equipment in a base station apparatus in the CPRI®.

The invention claim is:

1. A synchronous follow-up apparatus, comprising:
a PLL portion that outputs a first clock signal; and
a control loop portion that includes:
a reference frequency signal generating portion that outputs a reference frequency signal;
a clock signal generating portion that generates a second clock signal having the same frequency as a frequency of the first clock signal based on the reference frequency signal; and
a frequency control signal generating portion that generates a frequency control signal to change the frequency of the second clock signal based on a frequency difference between the first clock signal and the second clock signal and outputs the frequency control signal to the clock signal generating portion,
wherein the frequency control signal generating portion includes:
a first counter which is operated synchronously with the frequency of the first clock signal;
a second counter which is operated synchronously with the frequency of the second clock signal; and
a calculator which calculates a phase difference between output signals output from the first and second counters that occurs after a predetermined time, and generates the frequency difference between the first clock signal and the second clock signal based on the calculated phase difference.

2. The synchronous follow-up apparatus as set forth in claim 1, wherein the PLL portion includes:
a voltage controlled oscillating portion that outputs an output signal as the first clock signal; and
a control voltage generating portion that detects a phase difference between a receiving signal and the output signal from the voltage controlled oscillating portion and generates a control voltage signal for inputting to the voltage controlled oscillating portion based on the phase difference.

3. The synchronous follow-up apparatus as set forth in claim 1, wherein the PLL portion is an LSI having a PLL function.

4. The synchronous follow-up apparatus as set forth in claim 1, wherein the frequency control signal generating portion outputs a preceding frequency control signal which achieved a frequency tuning between the first clock signal and the second clock signal most recently when the detected frequency difference between the first clock signal and the second clock signal is equal to or greater than a predetermined value; and
wherein the clock signal generating portion outputs the second clock signal as a radio reference signal based on the frequency control signal output from the frequency control signal generating portion.

5. A synchronous follow-up method, comprising:
outputting a first clock signal from a PLL portion;
outputting a reference frequency signal;
generating a second clock signal having the same frequency as a frequency of the first clock signal based on the reference frequency signal;
calculating a phase difference between output signals output from a first counter which is operated synchronously with the frequency of the first clock signal and a second counter which is operated synchronously with the frequency of the second clock signal that occurs after a predetermined time;
detecting a frequency difference between the first clock signal and the second clock signal based on the calculated phase difference;
generating a frequency control signal based on the frequency difference; and
outputting the frequency control signal to change the frequency of the second clock signal.

6. The synchronous follow-up method as set forth in claim 5, further comprising:
outputting an output signal from a voltage controlled oscillating portion as the first clock signal;
detecting a phase difference between a receiving signal and the output signal; and
generating a control voltage signal based on the phase difference to change the frequency of the output signal.

7. The synchronous follow-up method as set forth in claim 5, wherein, in the generating process of the frequency control signal, a preceding frequency control signal which achieved a frequency tuning between the first clock signal and the second clock signal most recently is generated when the frequency difference in the detecting process is equal to or greater than a predetermined value; and the synchronous follow-up method further comprises, outputting the second clock signal as a radio reference signal based on the frequency control signal.

* * * * *

UNITED STATES PATENT AND TRADEMARK OFFICE
CERTIFICATE OF CORRECTION

PATENT NO.         : 7,457,979 B2  
APPLICATION NO.    : 10/598617  
DATED              : November 25, 2008  
INVENTOR(S)        : Hiroshi Itahara Page 1 of 1

It is certified that error appears in the above-identified patent and that said Letters Patent is hereby corrected as shown below:

In column 3, line 42, please delete "of the invention," and insert therefore -- of the invention; --

In column 4, line 23, please delete "0.002" and insert therefore -- ±0.002 --

In column 5, line 53, please delete "0.05" and insert therefore -- ±0.05 --

Signed and Sealed this

Tenth Day of March, 2009

JOHN DOLL  
*Acting Director of the United States Patent and Trademark Office*